United States Patent
Zhao et al.

(10) Patent No.: US 10,180,612 B2
(45) Date of Patent: Jan. 15, 2019

(54) ARRAY SUBSTRATE, SEMICONDUCTOR DEVICE CONTAINING THE SAME, CONTROL METHOD THEREOF, AND FABRICATION METHOD THEREOF

(71) Applicants: BOE TECHNOLOGY GROUP CO., LTD, Beijing (CN); HEFEI XINSHENG OPTOELECTRONICS TECHNOLOGY CO., LTD., Hefei (CN)

(72) Inventors: Jian Zhao, Beijing (CN); Xuebing Jiang, Beijing (CN); Jinliang Liu, Beijing (CN)

(73) Assignees: BOE TECHNOLOGY GROUP CO., LTD, Beijing (CN); HEFEI XINSHENG OPTOELECTRONICS TECHNOLOGY CO., LTD, Hefei (CN)

( * ) Notice: Subject to any disclaimer, the term of this patent is extended or adjusted under 35 U.S.C. 154(b) by 34 days.

(21) Appl. No.: 15/324,295

(22) PCT Filed: Jun. 7, 2016

(86) PCT No.: PCT/CN2016/085091
§ 371 (c)(1),
(2) Date: Jan. 6, 2017

(87) PCT Pub. No.: WO2017/088449
PCT Pub. Date: Jun. 1, 2017

(65) Prior Publication Data
US 2017/0299907 A1    Oct. 19, 2017

(30) Foreign Application Priority Data

Nov. 24, 2015 (CN) .......................... 2015 1 0822099

(51) Int. Cl.
*G02F 1/1368* (2006.01)
*G02F 1/1343* (2006.01)
(Continued)

(52) U.S. Cl.
CPC ...... *G02F 1/1368* (2013.01); *G02F 1/134309* (2013.01); *G02F 1/136286* (2013.01);
(Continued)

(58) Field of Classification Search
None
See application file for complete search history.

(56) References Cited

U.S. PATENT DOCUMENTS 9,024,913 B1 * 5/2015 Jung ...................... G06F 3/044
178/18.06
2008/0284928 A1 * 11/2008 Sakamoto ......... G02F 1/133555
349/37
(Continued)

FOREIGN PATENT DOCUMENTS

CN    103927072 A    7/2014
CN    104698638 A    6/2015
(Continued)

OTHER PUBLICATIONS

State Intellectual Property Office of the P.R.C (SIPO) Office Action 1 for 201510822099.8 dated Nov. 3, 2017 13 Pages.
(Continued)

*Primary Examiner* — Christopher J Kohlman
(74) *Attorney, Agent, or Firm* — Anova Law Group, PLLC (57) ABSTRACT

The present disclosure provides an array substrate. The array substrate includes a display region and a plurality of control lines, the display region being divided into a plurality of sub-regions, each sub-region comprising a plurality of pixels, each pixel including a common electrode. Common (Continued)

electrodes in pixels in a sub-region are electrically connected together; common electrodes in two sub-regions are connected by a switching unit; and a control line is connected with the common electrodes in the sub-region to provide a common voltage signal to the common electrodes.

19 Claims, 3 Drawing Sheets (51) Int. Cl.
    *G02F 1/1362*     (2006.01)
    *G09G 3/36*     (2006.01)
    *H01L 27/12*     (2006.01)
    *H03K 17/687*     (2006.01)

(52) U.S. Cl.
    CPC ......... *G09G 3/3648* (2013.01); *H01L 27/124* (2013.01); *H01L 27/1259* (2013.01); *G02F 2001/134345* (2013.01); *G02F 2001/136295* (2013.01); *G02F 2201/121* (2013.01); *G02F 2201/123* (2013.01); *G09G 2300/0426* (2013.01); *G09G 2300/0814* (2013.01); *G09G 2320/0247* (2013.01); *G09G 2320/0257* (2013.01); *H03K 17/6871* (2013.01)

(56) References Cited

U.S. PATENT DOCUMENTS

2008/0303967 A1* 12/2008 Huang ................ G09G 3/3655
    349/39
2012/0162184 A1      6/2012 Kim et al.

FOREIGN PATENT DOCUMENTS

| CN | 104991690 A | 10/2015 |
|---|---|---|
| CN | 204706018 U | 10/2015 |
| CN | 105022523 A | 11/2015 |
| CN | 105094479 A | 11/2015 |
| CN | 105278194 A | 1/2016 |
| CN | 205139542 U | 4/2016 |
| JP | H06208138 A | 7/1994 |

OTHER PUBLICATIONS

The World Intellectual Property Organization (WIPO) International Search Report for PCT/CN2016/085091 dated Aug. 26, 2016 p. 1-14.

State Intellectual Property Office of the P.R.C (SIPO) Office Action 2 for 201510822099.8 dated Jun. 15, 2018 14 Pages.

* cited by examiner

ARRAY SUBSTRATE, SEMICONDUCTOR DEVICE CONTAINING THE SAME, CONTROL METHOD THEREOF, AND FABRICATION METHOD THEREOF

CROSS-REFERENCES TO RELATED APPLICATIONS

This application is a national phase entry under 35 U.S.C. § 371 of International Application No. PCT/CN2016/085091, filed on Jun. 7, 2016, which claims priority to Chinese Patent Application No. 201510822099.8, filed on Nov. 24, 2015. The above enumerated patent applications are incorporated by reference herein in their entirety.

TECHNICAL FIELD

The present invention generally relates to the display technologies and, more particularly, relates to an array substrate, a semiconductor device containing the array substrate, a control method for controlling the array substrate, and a fabrication method for forming the array substrate.

BACKGROUND

Often, liquid crystal display (LCD) devices are less bulky, have low power consumption, and have little or no radiation. Currently, LCD devices dominate the display device market.

Recently, large-sized LCD devices with high resolution have become a main trend in device market. Specifically, an LCD device includes an LCD display panel and a backlight source. The LCD device includes an array substrate, a packaging substrate, and a liquid crystal layer between the array substrate and the packaging substrate. The working principles of an LCD device includes applying an electric field between the pixel electrodes and the common electrodes to control the alignment of the liquid crystal molecules, so as to control the amount of light exiting the LCD device after passing through the liquid crystal layer. The LCD device then can be used to display desired images.

In such an LCD device, the voltages provided by the pixel electrodes on the array substrate may be transmitted by the data lines. The common electrodes may be electrically connected. The voltages provided by the common electrodes may be transmitted by the common electrode lines.

However, is a large-sized LCD device, the common electrodes may lack uniformity, which may cause the resistance of the common electrodes to be unevenly distributed. As a result, the voltages provided by the common electrodes, i.e., the common voltages, are not uniformly distributed across the LCD device. The voltages can cause flicker of the LCD device and cause residual (direct current) DC voltage in the LCD device. The alignment layer of the LCD device, often made of polyimide (PI), can be polarized and may generate afterimages. The image quality may be impaired. In addition, coupling effect may be formed between the common electrodes and the data lines on the array substrate, and the coupling effect may pull the common voltages applied by the common electrodes. Because the common voltages provided by the common electrodes lack uniformity, the pulling can cause various effects. For example, the brightness of the red and blue pixels may reduce, and the brightness of the green pixels may increase. Green tint or greenish images may be resulted.

BRIEF SUMMARY

The present disclosure provides an array substrate, a semiconductor device containing the array substrate, a method to control the array substrate, and a fabrication method for forming the array substrate. By using the disclosed fabrication method to form the array substrate, flicker, afterimage, and greenish images can be improved.

One aspect of the present disclosure includes an array substrate comprising: a display region and a plurality of control lines, the display region being divided into a plurality of sub-regions, each sub-region comprising a plurality of pixels, each pixel comprising a common electrode. Common electrodes in pixels in a sub-region are electrically connected together; common electrodes in two sub-regions are connected by a switching unit; and a control line is connected with the common electrodes in the sub-region to provide a common voltage signal to the common electrodes.

Optionally, a plurality of switching units is configured for connecting a plurality of sub-regions to form a desired range of sub-regions, common voltages applied on the common electrodes in the desired range of sub-regions being same.

Optionally, the array substrate further includes one or more first common electrode lines. In the sub-region, common electrodes are electrically connected together by the one or more first common electrode lines; and the first common electrode lines are parallel to gate lines along a first direction.

Optionally, the switching unit comprises a first thin-film transistor (TFT) with a first gate electrode, a first active layer, a first source electrode, and a first drain electrode, the first source electrode being electrically connected with common electrodes in one sub-region and the first drain electrode being electrically connected to common electrodes in another one of the two sub-regions.

Optionally, the switching unit includes a first thin-film transistor (TFT) with a first gate electrode, a first active layer, a first source electrode, and a first drain electrode, the first source electrode being electrically connected with first common lines in one sub-region and the first drain electrode being electrically connected to first common lines in another one of the two sub-regions.

Optionally, the first gate electrode is connected to a signal line, the signal line transmitting a turn-on signal to the first gate electrode to electrically connect the first source electrode and the first drain electrode.

Optionally, the first TFT is between adjacent pixels, the adjacent pixels being in two different sub-regions.

Optionally, a pixel further comprises a second TFT and a pixel electrode, the second TFT including a second gate electrode, a second active layer, a second source electrode, and a second drain electrode, the second gate electrode being electrically connected to a gate line, the second source electrode being electrically connected to a data line, and the second drain electrode being electrically connected to the pixel electrode.

Optionally, the array substrate according to claim 3, further comprising one or more second common electrode lines, in the sub-region, common electrodes are electrically connected together by the one or more second common electrode lines; and the second common electrode lines are parallel to data lines along a second direction, the first direction being different from the second direction.

Optionally, a control line is electrically connected to one of a first common electrode line and a second common electrode line.

Optionally, the array substrate further comprising a peripheral wiring region, control lines connected to sub-regions away from the peripheral wiring region are parallel to the data lines.

Another aspect of the present disclosure provides a semiconductor device, including one or more of the disclosed array substrates.

Another aspect of the present disclosure provides a fabrication method for fabricating an array substrate, the array substrate having a display region, the display region being divided into a plurality of sub-regions. The fabrication method includes forming a common electrode in a pixel; forming one or more switching units between different sub-regions for connecting common electrodes in the different sub-regions; and forming one or more control lines connected to each sub-region for providing a common voltage signal to the sub-region.

Optionally, the fabrication method further includes: in each sub-region, forming at least one of one or more first common electrode lines along a first direction and one or more second common electrode lines along a second direction for electrically connecting the common electrodes, the first direction being different from the second direction; between adjacent pixels, forming a first thin-film transistor (TFT) with a first gate electrode, a first active layer, a first source electrode, and a first drain electrode, the first source electrode and the first drain electrode each being electrically connected to common electrodes contained in a different sub-region; in a pixel, forming a second TFT and a pixel electrode, the second TFT including a second gate electrode, a second active layer, a second source electrode, and a second drain electrode; and forming a plurality of gate lines and a plurality of data lines, a second gate electrode being electrically connected to a gate line, the second source electrode being electrically connected to a data line, and the second drain electrode being electrically connected to the pixel electrode. The first common electrode lines are parallel to the gate lines, the first gate electrodes, the second gate electrodes, the gate lines, and the first common electrode lines are formed in a same patterning process.

Optionally, the first source electrodes, the first drain electrodes, and the pixel electrodes are formed through a same patterning process; or the first source electrodes, the first drain electrodes, the second source electrodes, and the second drain electrodes are formed through a same patterning process.

Optionally, the second common electrode lines are parallel to the data lines; the second common electrode lines, the data lines, the second source electrodes, and the second drain electrodes are formed through a same patterning process; or the second common electrode lines and the pixel electrodes are formed through a same patterning process.

Optionally, the array substrate further comprising a peripheral wiring region, the control lines connected to sub-regions away from the peripheral wiring region are parallel to the data lines, the control lines and the data lines being formed through a same patterning process.

Another aspect of the present disclosure provides a control method for controlling the disclosed array substrate. The control method includes transmitting a turn-on signal through signal lines to first TFTs in switching units connecting a desired range of sub-regions such that common electrodes in the desired range of sub-regions are electrically connected, the desired range of sub-regions containing a plurality of sub-regions, the common electrodes contained in the plurality of sub-regions providing a same common voltage; and applying a common voltage signal to the common electrodes in the desired range of sub-regions through at least one control line connected to the desired range of sub-regions.

Optionally, the turn-on signal is applied on the first gate electrode of a first TFT in the desired range of sub-regions to electrically connect the first source electrode and the first drain electrode of the first TFT.

Optionally, a plurality of desired ranges of sub-regions include all sub-regions in the array substrate.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

FIGS. 5(a) and (b) illustrate cross-sectional views of certain parts of an array substrate along the A-A direction and the B-B direction shown in FIG. 4.

DETAILED DESCRIPTION

For those skilled in the art to better understand the technical solution of the invention, reference will now be made in detail to exemplary embodiments of the invention, which are illustrated in the accompanying drawings. Wherever possible, the same reference numbers will be used throughout the drawings to refer to the same or like parts.

Unless defined otherwise, the technical terms or scientific terms used in the present disclosure refer to the ordinary meanings known by those skilled in the art. The terms "first", "second", and the like used in the specification and the claims of the present disclosure do not indicate any order, quantity, or difference in significance. Those terms are merely used to illustrate different parts of a structure. The terms "connected", "connection", "coupled", and the like are not limited to defining physical or mechanical connections/coupling. For example, those terms may also be used to define direct and indirect electrical connections.

A method to solve the issues about Green tint or greenish images is to compensate and modulate the common voltages. However, because the common electrodes are electrically connected, if the existing method is used in a large-sized LCD display panel to compensate and modulate the common electrodes, only local effects cause by feed-through voltages can be improved. A feed-through voltage ($\Delta Vp$) refers to the difference between the common voltage inputted into a common electrode line and the common voltage provided by the common electrode. Such a method may improve $\Delta Vp$ and reduce local effects caused by $\Delta Vp$, however, it would not improve the flicker, afterimages, and greenish image effect across the entire LCD display panel.

The present disclosure provides an array substrate, a fabrication method to form the array substrate, a semiconductor containing the array substrate, and a control method for controlling the array substrate. According to the present disclosure, the display region of the array substrate may be divided into a plurality of sub-regions. The common electrodes in a sub-region may be electrically connected together so that the common electrodes in different sub-regions may be electrically connected through switching units. Common electrodes in different sub-regions may be selected to be electrically connected. Further, common electrodes, in different sub-regions and providing consistent or same common voltages, may be electrically connected through switching units. Control lines corresponding to the sub-regions may be used to apply suitable voltage signals on the common electrodes in the sub-regions that are electrically connected. Thus, common voltages provided by the common electrodes in different sub-regions that are electrically connected together may be compensated and modulated. The feed-through voltages in all sub-regions may be consistent or same. It should be noted that, in different embodiments, all the sub-regions may be connected with switching units or only some of the sub regions may be connected with switching units. The number of sub-regions connected with switching units should be determined according to different applications and should not be limited by the embodiments of the present disclosure.

In embodiments of the present disclosure, the common voltages provided by the common electrodes of the array substrate may have improved uniformity, and issues such as flicker and afterimage may be improved. In addition, in a sub-region, because the common electrodes are each disposed in a different pixel, coupling effect between the common electrode lines and data lines may be reduced. The pulling of the common voltages by the voltages of the data lines may be reduced or minimized. Greenish images may be reduced or improved.

FIGS. 1-4 each illustrates a view of the structure of the disclosed array substrate. FIGS. 5(*a*) and (*b*) illustrate cross-sectional views along the A-A direction and the B-B direction in the structure shown in FIG. 4.

Figure 1:
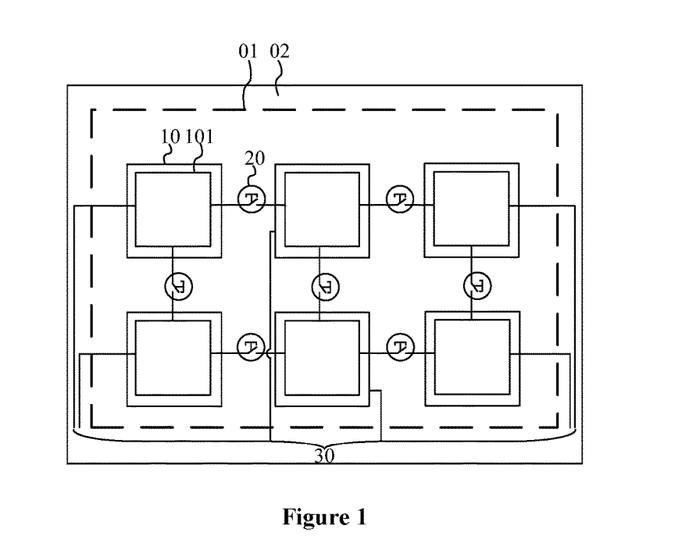
FIG. 1 illustrates a structure of an exemplary array substrate according to various disclosed embodiments of the present disclosure.

One aspect of the present disclosure provides an array substrate. As shown in FIG. 1, the array substrate includes a display region 01 and a peripheral wiring region 02. The display region 01 may include a plurality of sub-regions 10. In each sub-region 10, the common electrodes 101 of the pixels may be connected together. The common electrodes of two different sub-regions 10 may be connected through a switching unit 20. For example, the common electrodes of two adjacent sub-regions 10 may be connected through a switching unit 20. The array substrate may also include a control line 30 corresponding to or connected to a sub-region 10. A control line 30 may provide a common voltage signal to the common electrodes 101 in the connected or corresponding sub-region 10.

It should be noted that, in the present disclosure, the electrical connection between the common electrodes 101 in a sub-region 10 may be any suitable types of electrical connection. Further, a switching unit 20 may be placed at any suitable location. In some embodiments, the switching units 20 may be disposed at locations that would not impair the displaying of images. Also, a switching unit 20 may be of any suitable structure. It is only required that the common electrodes 101 of different sub-regions 10, connected to a switching unit 10 to be electrically connected through the switching unit 20. Further, the control lines 30 of the sub-regions 10 that are located close to the peripheral wiring region 02 may be arranged in the peripheral wiring region 02 to reduce any adverse effect of the control lines 30 may have on the displaying of images.

The display region 01 of the disclosed array substrate may be divided into a plurality of sub-regions 10. The common electrodes 101 in a sub-region 10 may be electrically connected, and common electrodes 101 in different sub-regions 10 may be connected through switching units 20 so that common electrodes 101 in different sub-regions 10 may be electrically connected. In other words, common electrodes 101 in certain sub-regions 10 may be selected to be connected together according to certain conditions. The plurality of sub-regions 10 that are electrically connected together may be referred as a desired range of sub-regions 10, for illustrative and descriptive purposes. Thus, the switching units 20 may be used to electrically connect common electrodes 101 in the sub-regions 10 having consistent or same common voltages. That is, the common voltage provided by the common electrodes 101 in the same desired range of sub-regions 10 may be consistent or the same. The control lines 30 may be used to apply a desired voltage on the common electrodes 101 in a desired range of sub-regions 10 to compensate and modulate the common voltage. Thus, the control lines 30 in the display region 10 may input suitable voltages to different desired range of sub-regions 10 to compensate and modulate the common voltages in the desired ranges of sub-regions 10, so that the feed-through voltages in all sub-regions 10 may be consistent or same. Thus, the common voltages provided by the common electrodes 101 of the array substrate may be uniformed, and issues such as flicker and afterimage may be reduced. In addition, in a sub-region, because the common electrodes are each disposed in a different pixel, coupling effect between the common electrode lines and data lines may be reduced. Thus, the pulling of the common voltages by the voltages provided by the data lines may be minimized or reduced. Greenish images may be reduced or improved.

Figure 2:
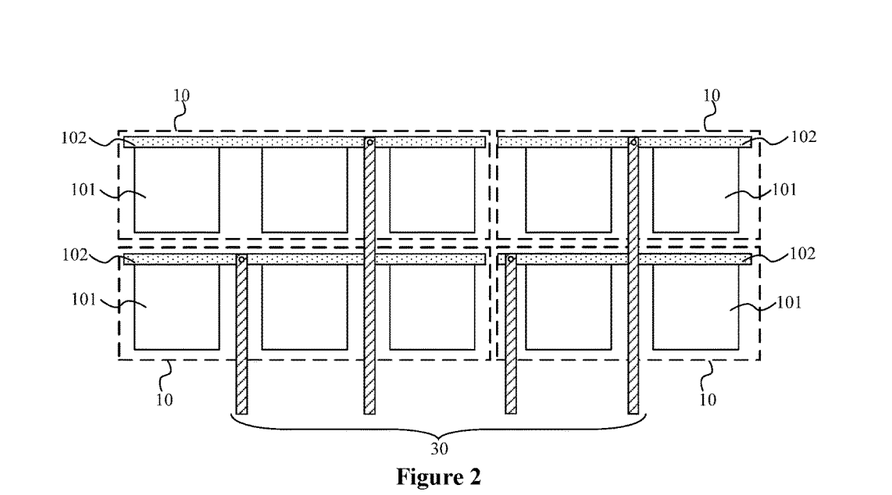
FIG. 2 illustrates another structure of an exemplary array substrate according to various disclosed embodiments of the present disclosure.
Figure 3:
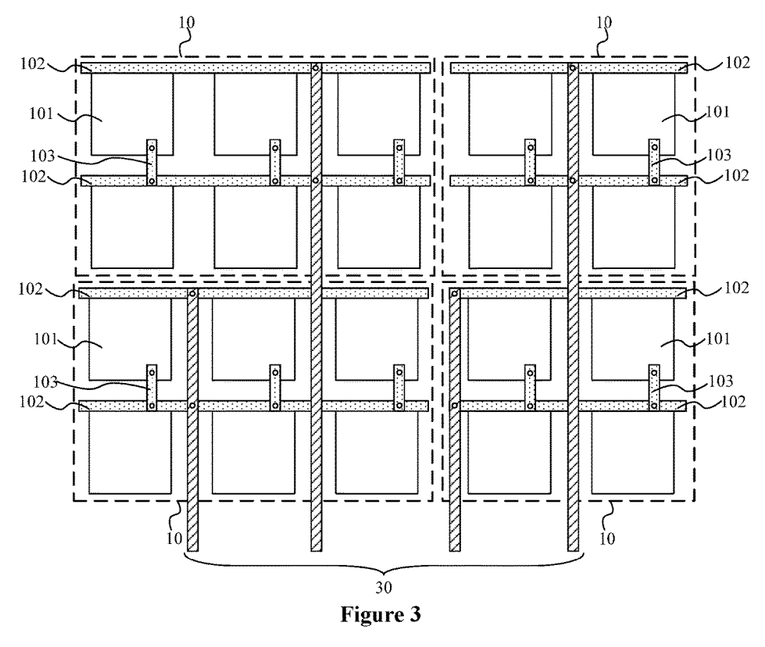
FIG. 3 illustrates another structure of an exemplary array substrate according to various disclosed embodiments of the present disclosure.

As shown in FIGS. 2 and 3, a dashed line box may represent a sub-region 10. The common electrodes 101 in one sub-region 10 may be electrically connected through first common electrode lines 102 along the first direction. In one embodiment, the common electrodes 101 in one sub-region 10 may also be electrically connected through second common electrode lines 103 along the second direction. The first direction and the second direction may be different directions, i.e., they may not be parallel to each other.

For example, as shown in FIGS. 2 and 3, if a sub-region 10 only includes two or more common electrodes 101 disposed along the first direction, the common electrodes 101 in the sub-region 10 may be electrically connected through one or more first common electrode lines 102. If a sub-region 10 only includes two or more common electrodes 101 disposed along the second direction, the common electrodes 101 in the sub-region 10 may be electrically connected through one or more second common electrode lines 103.

As shown in FIG. 3, if a sub-region 10 includes a plurality of common electrodes 101 arranged as an array along the first direction and the second direction, the plurality of common electrodes 101 may be electrically connected through one or more first common electrode lines 102 along the first direction and one or more second common electrode lines 103 along the second direction. For example, as shown in FIG. 3, two adjacent common electrodes 101 disposed along the second direction may be electrically connected by a second common electrode line 103.

In some embodiments, the first direction may be the horizontal direction and the second direction may be the vertical direction. In other various embodiments, the first direction and the second direction may be other suitable directions and should not be limited by the embodiments of the present disclosure.

Figure 4:
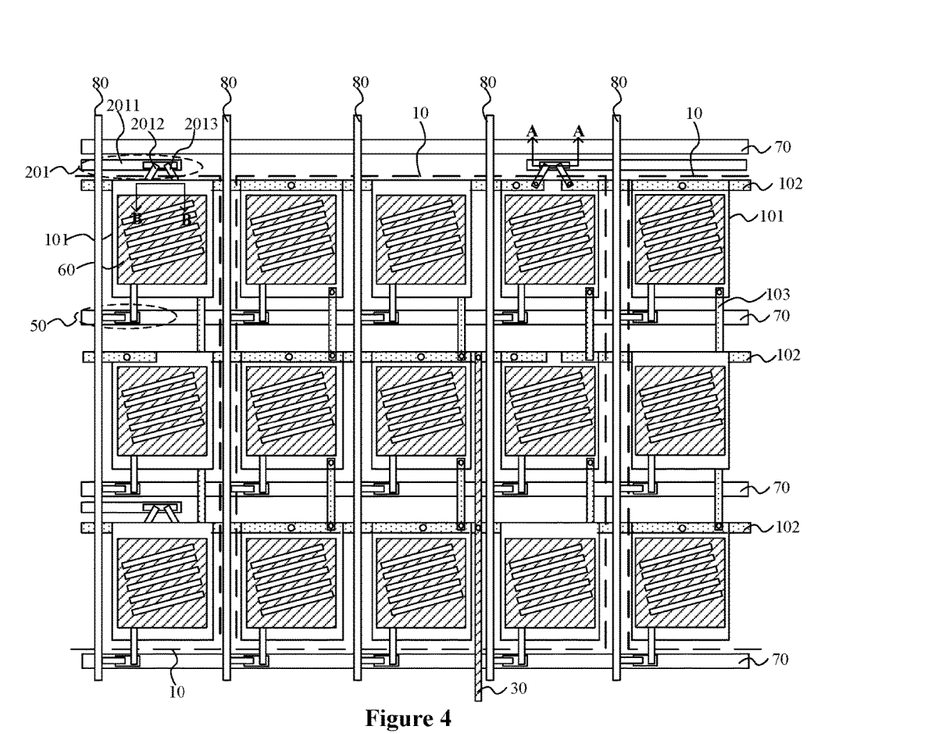
FIG. 4 illustrates a detailed structure of an exemplary array substrate according to various disclosed embodiments of the present disclosure.
Figure 5:
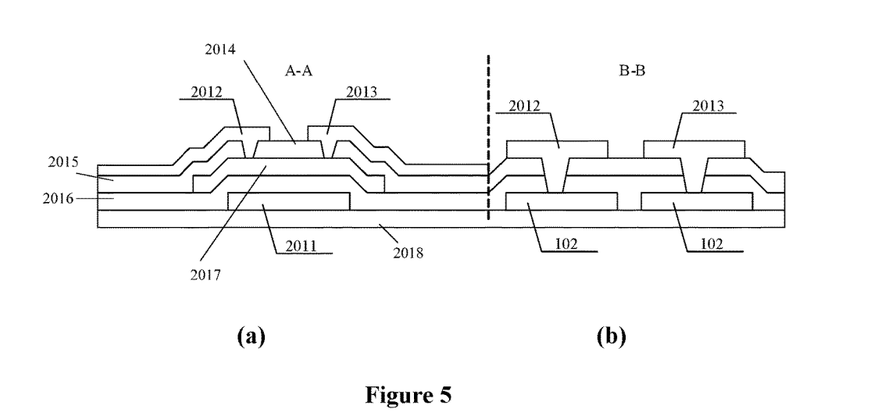

Further, as shown in FIGS. 4 and 5, in some embodiments, a switching unit 20 may include a first thin-film transistor (TFT) 201. The first TFT 201 may include a first gate electrode 2011, a first active layer 2017, a first source electrode 2012, and a first drain electrode 2013. The first source electrode 2012 and the first drain electrode 2013 may each be electrically connected to a common electrode 101 in a different sub-region 10.

According to the present disclosure, when a suitable voltage is applied on a first gate electrode 2011, the first source electrode 2012 and the first drain electrode 2013 may be turned on or electrically connected so that the common electrodes 101 in different sub-regions 10 may be electrically connected through the first source electrode 2012 and the first drain electrode 2013. In operation, a turn-on signal may be applied on the first gate electrode 2011 of a switching unit 20 through a signal line to turn on the switching unit 20 such that common electrodes 101 in different sub-regions 10 may be electrically connected.

In the present disclosure, a first gate electrode 2011 may be of any suitable shape, and any suitable methods may be used to provide power or voltage to a first gate electrode 2011. It is only required that the first source electrodes 2012 and the first drain electrodes 2013 can be turned on or connected through the first gate electrodes 2011.

In some embodiments, a first gate electrode 2011 may have a stripe shape and may extend to the peripheral wiring region 02 (as shown in FIG. 1). Wiring in the peripheral wiring region 02 may be arranged or adjusted so that suitable wires may provide signals to the first gate electrodes 2011. Thus, the fabrication of the array substrate may be simplified.

Further, because the common electrodes 101 in a sub-region 10 are electrically connected together, if a first source electrode 2012 and the corresponding first drain electrode 2013 are each electrically connected to any one of a first common electrode line 102, a second common electrode line 103, and a common electrode 101 in the two different sub-regions 10, common electrodes 101 in the two different sub-regions 10 may be electrically connected.

Further, referring to FIG. 4, in some embodiments, a first TFT 201 may be arranged between adjacent rows of pixels or between adjacent columns of pixels, where the adjacent rows of pixels may each be contained in a different sub-region 10 and the adjacent columns of pixels may each be contained in a different sub-region 10. Thus, the arrangement of the TFTs 201 may reduce the adverse effect of the TFTs 201 on the aperture ratio of the array substrate.

Further, referring to FIG. 4, a pixel may also include a second TFT 50 and a pixel electrode 60. A second TFT 50 may include a second gate electrode, a second active layer (not shown), a second source electrode and a second drain electrode. The second gate electrode may be electrically connected to a gate line 70. The second source electrode may be electrically connected to a data line 80. The second drain electrode may be connected to a pixel electrode 60.

In various embodiments of the present disclosure, a second TFT 50 may be one of an amorphous silicon TFT, a low temperature polysilicon TFT, an oxide TFT, and an organic TFT. The second TFT 50 may be a top-gated TFT or a bottom-gated TFT.

Referring to FIG. 4, when the array substrate includes first common electrode lines 102 disposed along the first direction and second common electrode lines 103 disposed along the second direction, in some embodiments, the first common electrode lines 102 may be parallel to the gate lines 70. In this case, the first gate electrodes 2011, the second gate electrodes, the gate lines 70, and the first common electrode lines 102 may be disposed in the same fabrication step.

That is, one patterning process may be used to form the first gate electrodes 2011, the second gate electrodes, the gate lines 70, and the first common electrode lines 102 in a same fabrication step. In this way, fewer steps of the patterning process are needed to form the array substrate.

In some embodiments, to avoid adverse effect of the first common electrode lines 102 on the aperture ratio of the array substrate, the first common electrode lines 102 may be arranged at the locations where no pixel electrodes 60 are disposed, in the display region 01.

Further, in some embodiments, the first source electrodes 2012, the first drain electrodes 2013, and the pixel electrodes 60 may be disposed in the same fabrication step. In some other embodiments, the first source electrodes 2012, the first drain electrodes 2013, the second source electrodes, and the second drain electrodes may be disposed in the same fabrication step.

In some embodiments, a first source electrode 2012 and a first drain electrode 2013 may each have a stripe shape. One terminal or one side of a first source electrode 2012 may be connected to the first active layer 2017 of the corresponding TFT 201, and the other terminal of the first source electrode 2012 may be connected to a first common electrode line 102 in a different sub-region 10. One terminal or one side of a first drain electrode 2013 may be connected to the first active layer 2017 of the corresponding TFT 201, and the other terminal of the first drain electrode 2012 may be connected to a first common electrode line 102 in a different sub-region 10. The corresponding TFT refers to the TFT that contains the described first source electrode 2012 and the first drain electrode 2013.

That is, in some embodiments, one patterning process may be used to form the first source electrodes 2012, the first drain electrodes 2013, and the pixel electrodes 60. In some other embodiments, one patterning process may be used to form the first source electrodes 2012, the first drain electrodes 2013, the second source electrodes, and the second drain electrodes. In this way, fewer steps of the patterning process may be needed to fabricate the array substrate.

Further, a first common electrode line 102 may be arranged between a first TFT 201 and a pixel electrode 60.

In some embodiments, referring to FIG. 4, the second common electrode lines 103 may be parallel to the data lines 80. The second common electrode lines 103, the data lines 80, the second source electrodes, and the second drain electrodes may be disposed in the same fabrication step. In some other embodiments, the second common electrode lines 103 and the pixel electrodes 60 may be disposed in the same fabrication step.

That is, in some embodiments, one patterning process may be used to form the second common electrode lines 103, the data lines 80, the second source electrodes, and the second drain electrodes. In some other embodiments, one patterning process may be used to form the second common electrode lines 103 and the pixel electrodes 60. Thus, fewer steps of the patterning process are needed for the fabrication of the array substrate.

In some embodiments, as referring to FIG. 4, a control line 30 may be connected to the first common electrode lines 102 in the corresponding or connected sub-region 10 to reduce or prevent any adverse effect the control line 30 may have on the displaying of images. In some other embodiments, a control line 30 may also be connected to the second common electrode lines 103 in the corresponding sub-region 10.

Further, in some embodiments, the control lines 30 may be parallel to the data lines 80, and the control lines 30 and the data lines 80 may be disposed in the same fabrication step.

That is, one patterning process may be performed to form the control lines 30 and the data lines 80. Thus, fewer steps of the patterning process are needed for the fabrication of the array substrate.

In some embodiments, a control line 30 may be disposed between adjacent pixel electrodes 60. Any adverse effect the control line 30 may have on the aperture ratio of the array substrate may be avoided.

In some embodiments, the first active layers 2017 and the second active layers may be disposed in the same fabrication step. The first active layers 2017 and the second active layers may be made of a same semiconductor material.

That is, one patterning process may be performed to form the first active layers 2017 and the second active layers. Thus, fewer steps of the patterning process are needed for the fabrication of the array substrate.

FIG. 5(a) and FIG. 5(b) illustrate cross-sectional views of two parts shown in FIG. 4, divided by the dashed line. FIG. 5(a) illustrates a cross-sectional view of a first TFT 201 along the A-A direction. The substrate 2018 may be made of any suitable material such as glass. The gate insulating layer 2016 may be disposed on the first gate electrode 2011. Element 2017 may be a barrier layer. The passivation layer 2015 may be disposed on the first active layer 2017. The passivation layer 2014 may be disposed on the first active layer 2017. The first source electrode 2012 and the first drain electrode 2013 may be disposed on the passivation layer 2015. The passivation layer 2014 and the passivation layer 2015 may be formed from a same passivation layer. Through holes may be formed in the passivation layer such that the first source electrode 2012 and the first drain electrode 2013 may be connected to the first active layer 2017.

FIG. 5(b) illustrates a cross-sectional view along, the B-B direction of a first TFT 201 being electrically connected to a first common electrode line 102 through the first source electrode 2012 and the first, drain electrode 2013. For viewing simplicity, same parts in FIG. 5(a) and FIG. 5(b) are aligned and separated by the dashed line. FIG. 5(b) shows a first source electrode 2012 and a first drain electrode 2013 each being electrically connected to a first common electrode line 102. The two common electrode lines 102 shown in FIG. 5(b) may be contained in different sub-regions 10.

In some certain embodiments, the first source electrode 2012 and the first drain electrode 2013 may be formed directly on the gate insulating layer 2016 and contacting the first active layer 2017, instead of being formed on the passivation layers 2014 and 2015 and connected to the first active layer 2017 through the through holes. A passivation layer may be formed to cover the first source electrode 2012 and the first drain electrode 2013. The specific structure of a first TFT 201 may be subjected to different applications and should not be limited by the embodiments of the present disclosure.

Another aspect of the present disclosure provides a semiconductor device. In some embodiments, the semiconductor device may be a display apparatus. The semiconductor device may include one or more of the disclosed array substrates.

The display apparatus may be an LED apparatus, including an LED panel, an LED television, a digital frame, a mobile phone, a tablet, and any product or parts that have display functions.

Another aspect of the present disclosure provides a fabrication method for forming the disclosed array substrate.

Referring back to FIG. 1, the array substrate may include a display region 01 and a peripheral wiring region 02. The display region 01 may include a plurality of sub-regions 10. According to the fabrication method, a common electrode 101 may be formed in a pixel. The common electrodes 101 of the pixels in the same sub-region 10 may be electrically connected together. One or more switching units 20 may be formed between the common electrodes of different sub-regions 10. A control line 30 corresponding to or connected to a sub-region 10 may be formed so that the control line 30 may provide voltage signals for common electrodes 101 in the same sub-region 10.

According to the fabrication method, the display region 01 of the disclosed array substrate may be divided into a plurality of sub-regions 10. The common electrodes 101 in a sub-region 10 may be electrically connected together, and common electrodes 101 in different sub-regions 10 may be connected through switching units 20 so that common electrodes 101 in desired sub-regions 10 may be connected. In other words, common electrodes 101 in certain or desired sub-regions 10 may be selected to be connected together according to certain conditions. The plurality of sub-regions 10 that are electrically connected together may be referred to as a desired range of sub-regions 10, for illustrative and descriptive purposes. Thus, the switching units 20 may be used to electrically connect common electrodes 101 in the sub-regions 10 having consistent or same common voltages provided by the common electrodes 101. That is, the common voltage provided by the common electrodes 101 in the same desired range of sub-regions 10 may be consistent or same. The control lines 30 may be used to apply a desired voltage on the common electrodes 101 in a desired range of sub-regions 10 to compensate and modulate the common voltage. Thus, the control lines 30 in the display region 10 may input suitable voltages to different desired range of sub-regions 10 to compensate and modulate the common voltages in the desired range of sub-regions 10, so that the feed-through voltages in all sub-regions 10 of the array substrate may be consistent or same. Thus, the common voltages provided by the common electrodes 101 of the array substrate may have improved uniformity, and issues such as flicker and afterimage may be improved. In addition, because the common electrodes 101 in each sub-region 10 may each be arranged in a different pixel, coupling effect between the common electrodes 101 and the data lines may be reduced. Thus, the pulling of the common voltages by the voltages provided by the data lines may be minimized or reduced. Greenish images may be reduced or improved.

In some embodiments, as shown in FIGS. 4 and 5, a common electrode 101 may be formed in each pixel. The common electrodes 101 in the pixels contained in the same sub-region 10 may be electrically connected together. For example, a common electrode 101 may be formed in each pixel. First common electrode lines 102 disposed along the first direction and second common electrode lines 103 disposed along the second direction may be formed. The common electrodes 101 in the same sub-region 10 may be connected through first common electrode lines 102 and/or second common electrode lines 103. The first direction and the second direction may be different directions, i.e., not being parallel to each other.

The fabrication method may include forming switching units 20. To form a switching unit 20, A first TFT 201 may be formed between adjacent rows of pixels or columns of pixels, where the rows of pixels are each in a different sub-region 10 and the columns of pixels are each in a different sub-region 10. A first TFT 201 may include a first gate electrode 2011, a first active layer, a first source electrode 2012, and a first drain electrode 2013. The first source electrode 2012 and the first drain electrode 2013 may each be connected to the common electrodes 101 in a different sub-region 10.

Further, the fabrication method may also include thrilling a second TFT 50 and a pixel electrode 60 in each pixel. A second TFT 50 may include a second gate electrode, a second active layer, a second source electrode and a second drain electrode. The fabrication method may further include forming gate lines 70 electrically connected to the second gate electrodes and data lines 80 electrically connected to the second source electrodes.

The first common electrode lines 102 may be parallel to the gate lines 70. The first gate electrodes 2011, the second gate electrodes, the gate lines 70, and the first common electrode lines 102 may be formed through a same step in the patterning process.

In some embodiments, a first gate electrode 2011 may have a stripe shape and may extend to the peripheral wiring region 02. Wiring in the peripheral wiring region 02 may be arranged or adjusted so that suitable wires may provide signals to the first gate electrodes 2011. In this way, the fabrication of the array substrate may be simplified.

Further, in some embodiments, for those sub-regions 10 located close to the peripheral wiring region 02, the control lines 30 corresponding to or connected to the sub-regions 10 may be arranged to be in the peripheral wiring region 02 to reduce any adverse effect the control lines 30 may have on the displaying of images.

In addition, in some embodiments, the control lines 30 may be electrically connected to the first common electrode lines 102 and/or the second common electrode lines 103 in a sub-region 10 to reduce any adverse effect the control lines 30 may have on the displaying of images. Specifically, for those sub-regions 10 located further away from the peripheral wiring region 02, one or more control lines 30 may be formed along the second direction and between columns of pixels to connect the first common electrode lines 102 disposed along the first direction. The control lines 30 may be parallel to the data lines 80. The control lines 30 may be used to connect the first common electrode lines 102 to the peripheral wiring region 02 for wiring and controlling. The control lines 30 may be formed in a same fabrication step as the first source electrode 2012 and the first drain electrode 2013, and may be electrically connected to the common electrode lines 102 through via holes. In some other embodiments, one or more control lines 30 may also be formed along the first direction and between rows of pixels to connect the second common electrode lines 103 disposed along the second direction. The specific alignment of control lines 30 should be determined according to different applications and should not be limited to the embodiments of the present disclosure.

In the present disclosure, because the first gate electrodes 2011, the second gate electrodes, the gate lines 70, and the first common electrode lines 102 may be thrilled through one step of the patterning process, fewer steps of the patterning process are needed for fabricating the array substrate. The fabrication process may be less costly.

Further, in some embodiments, the first TFTs 201, the second TFTs 50, and the pixel electrodes 60 may be formed through the same fabrication steps. For example, the first source electrodes 2012, the first drain electrodes 2013, and the pixel electrodes 60 may be formed through a same step of the patterning process. In some other embodiments, the first source electrodes 2012, the first drain electrodes 2013, the second source electrodes, the second drain electrodes may be formed through a same step of the patterning process. A first source electrode 2012 and a first drain electrode 2013 may each have a stripe shape. One terminal or one side of a first source electrode 2012 may be connected to the first active layer of the corresponding TFT 201, and the other terminal of the first source electrode 2012 may be connected to a first common electrode line 102 in a different sub-region 10. One terminal or one side of a first drain electrode 2013 may be connected to the first active layer of the corresponding TFT 201, and the other terminal of the first drain electrode 2012 may be connected to a first common electrode line 102 in a different sub-region 10. The corresponding TFT refers to the TFT that contains the described first source electrode 2012 and the first drain electrode 2013.

In embodiments of the present disclosure, by using the described fabrication method, fewer steps of the patterning processes may be used to form the array substrate.

In some embodiments, the first TFTs 201, the second TFTs 50, and the pixel electrodes 60 may be formed through the same fabrication steps. For example, a patterning process may be performed to form the first gate electrodes 2011 and the second gate electrodes. Further, a patterning process may be performed to form the first active layers and the second active layers. Further, a patterning process may be performed to form the second source electrodes and the second drain electrodes. Further, a patterning process may be performed to form the first source electrodes 2012, the first drain electrodes 2013, and the pixel electrodes 60.

In some other embodiments, the first TFTs 201, the second TFTs 50, and the pixel electrodes 60 may be formed through the same fabrication steps. For example, a patterning process may be performed to form the first gate electrodes 2011 and the second gate electrodes. Further, a patterning process may be performed to form the first active layers and the second active layers. Further, a patterning process may be performed to form the first source electrodes 2012, the first drain electrodes 2013, the second source electrodes, and the second drain electrodes. Further, a patterning process may be performed to form the pixel electrodes 60.

Further, in some embodiments, referring to FIG. 4, the second common electrode lines 103 may be parallel to the data lines 80. The second common electrode lines 103, the data lines 80, the second source electrodes, and the second drain electrodes may be formed through a same patterning process. In some other embodiments, the second common electrode lines 103 and the pixel electrodes 60 may be formed through a same patterning process. Thus, fewer steps of the patterning processes are required to fabricate the array substrate.

In some embodiments, referring to FIG. 4, the control lines 30 may be parallel to the data lines 80, and the control lines 30 and the data lines 80 may be formed through one patterning process. Thus, few steps are required in the patterning processes to fabricate the array substrate.

Another aspect of the present disclosure provides a control method for controlling the disclosed array substrate. The control method may include transmitting a turn-on signal, through a signal line, to the switching units 20 in at least one desired range of sub-regions 10 of the array substrate so that the common electrodes 101 in the sub-regions 10 within a desired range of sub-regions 10 may be electrically connected. The turn-on signal may be applied on the first gate electrode 2011 of a switching, unit 20 such that the first source electrode 2012 and the first drain electrode 2013 of the switching unit may be connected to further connect the sub-regions 10. The control method may also include applying a common voltage signal on the common electrodes 101 in the at least one desired range of sub-region 10 through at least one control 30, where the control lines 30 may be corresponding to or connected to the common electrodes 101 within the desired range of sub-regions 10. In some embodiments, the desired ranges of sub-regions 10 may be predetermined. A common voltage signal may be a modulated signal. By applying common voltage signals on different desired ranges of sub-regions 10, the feed-through voltages of the desired ranges of sub-regions 10 may be the same.

According to the present disclosure, a desired range of sub-regions 10 may include a plurality of sub-regions 10. In a desired range of sub-regions 10, the common voltages provided by the common electrodes 101 may be consistent or the same.

Further, the number of desired ranges of sub-regions 10 should be determined according to different embodiments and applications and should not be limited to a certain number. When two or more desired ranges of sub-regions 10 are formed, common voltage signals may be applied on the common electrodes 101 in the desired ranges of sub-regions 10 through the control lines 30 corresponding to or connected to the desired ranges of sub-regions 10.

Further, the turn-on signal transmitted to the switching units 20 may refer to a signal capable of turn on or connect the switching units 20 such that the common electrodes 101 in different sub-regions 10 may be electrically connected.

According to the control method for controlling the array substrate, different desired ranges of sub-regions 10 may be determined based on the distribution of common voltages provided by the common electrodes 101 in the array substrate. The common voltage provided by the common electrodes 101 in a desired range of sub-regions 10 may be consistent or same. Thus, by electrically connecting the common electrodes 101 in a desired range of sub-regions 10 and applying a suitable common voltage signal on the common electrodes 101 in the desired range of sub-regions 10 through the corresponding control lines 30, the common voltages provided by the common electrodes 101 in the desired range of sub-regions 10 may be compensated and modulated. Further, because the common electrodes in each desired range of sub-regions 10 may be compensated and modulated by the corresponding control lines 30, by transmitting a suitable common voltage signal, the feed-through voltages in all sub-regions 10 of the array substrate may be consistent or same. Thus, the common voltages provided by the common on electrodes 101 may have improved uniformity. Issues such as flicker and afterimages may be reduced.

In some embodiments, when a switching unit 20 includes a first TFT 201, a turn-on signal may be inputted to the switching units 20 in a desired range of sub-regions 10. Specifically, the turn-on signal may be applied on the first gate electrodes 2011 of the first TFTs 201 in the desired range of sub-regions 10. Suitable wirings may be arranged in the array substrate to provide the turn-on signal to the first gate electrodes 2011. For a first gate electrode 2011 that extends to the peripheral wiring region 02, suitable wirings arranged in the peripheral wiring region 02 may transmit the turn-on signal to the first gate electrodes 2011.

Further, after a first gate electrode 2011 receives the turn-on signal, the first source electrode 2012 and the first drain electrode 2013 of the same first TFT may be turned on or connected. Thus, the first TFT 201 may be configured to electrically connect common electrodes 101 in different sub-regions 10.

Further, in some embodiments, all the control lines 30 corresponding to or connected to a desired range of sub-regions 10 may be configured to apply a common voltage signal on the common electrodes 101 in the desired range of sub-regions 10. That is, a same common voltage signal may be applied on the control lines 30 corresponding to all the sub-regions 10 in the desired range of sub-regions 10.

In some embodiments, all the common electrodes 101 in the array substrate may be divided into a plurality of desired ranges of sub-regions 10. In this case, a plurality of common voltage signals may be applied on the plurality of desired ranges of sub-regions 10 through the control lines 30 connected to the plurality of desired ranges of sub-regions 10 to compensate and modulate the common voltages provided by the common electrodes in the plurality of desired ranges of sub-regions 10. Thus, feed-through voltages in all the common electrodes 101 may be the same.

By applying the disclosed control method to control the array substrate, the common voltages provided by the common electrodes 101 in the array substrate may have improved uniformity. Issues such as flicker and afterimage may be reduced.

The present disclosure provides an array substrate, a fabrication method to form the array substrate, a semiconductor device containing the array substrate, and a control method for controlling the array substrate. According to the present disclosure, the display region of the array substrate may be divided into a plurality of regions. The common electrodes in a sub-region may be electrically connected together so that the common electrodes in different sub-regions may be electrically connected through switching units. Common electrodes in different sub-regions may be selected to be electrically connected. Further, common electrodes, in different sub-regions and providing consistent or same common voltages, may be electrically connected through switching units. Control lines corresponding to the sub-regions may be used to apply suitable voltage signals on the common electrodes in the sub-regions that are electrically connected. Thus, common voltages provided by the common electrodes in different sub-regions that are electrically connected together may be compensated and modulated. The feed-through voltages in all sub-regions may be consistent or same. The common voltages provided by the common electrodes of the array substrate may have improved uniformity, and issues such as flicker and afterimage may be improved. The pulling of the common voltages by the voltages of the data lines may be reduced or minimized. Greenish images may be reduced.

It should be understood that the above embodiments disclosed herein are exemplary only and not limiting the scope of this disclosure. Without departing from the spirit and scope of this invention, other modifications, equivalents, or improvements to the disclosed embodiments are obvious to those skilled in the art and are intended to be encompassed within the scope of the present disclosure.

What is claimed is:

1. An array substrate comprising: a display region and a plurality of control lines, the display region being divided into a plurality of sub-regions, each sub-region comprising a plurality of pixels, each pixel comprising a common electrode, wherein:
- common electrodes in pixels in a sub-region are electrically connected together;
- common electrodes in two sub-regions are connected by a switching unit, wherein the switching unit is arranged between adjacent pixels, and the adjacent pixels are located in two different sub-regions; and
- a control line is connected with the common electrodes in the sub-region to provide a common voltage signal to the common electrodes.

2. The array substrate according to claim 1, wherein a plurality of switching units is configured for connecting a plurality of sub-regions to form a desired range of sub-regions, common voltages applied on the common electrodes in the desired range of sub-regions being same.

3. The array substrate according to claim 2, further comprising one or more first common electrode lines, wherein:
- in the sub-region, common electrodes are electrically connected together by the one or more first common electrode lines; and
- the first common electrode lines are parallel to gate lines along a first direction.

4. The array substrate according to claim 3, wherein the switching unit includes a first thin-film transistor (TFT) with a first gate electrode, a first active layer, a first source electrode, and a first drain electrode, the first source electrode being electrically connected with first common lines in one sub-region and the first drain electrode being electrically connected to first common lines in another one of the two sub-regions.

5. The array substrate according to claim 3, further comprising one or more second common electrode lines, wherein:
- in the sub-region, common electrodes are electrically connected together by the one or more second common electrode lines; and
- the second common electrode lines are parallel to data lines along a second direction, the first direction being different from the second direction.

6. The array substrate according to claim 5, wherein a control line is electrically connected to one of a first common electrode line and a second common electrode line.

7. The array substrate according to claim 2, wherein the switching unit comprises a first thin-film transistor (TFT) with a first gate electrode, a first active layer, a first source electrode, and a first drain electrode, the first source electrode being electrically connected with common electrodes in one sub-region and the first drain electrode being electrically connected to common electrodes in another one of the two sub-regions.

8. The array substrate according to claim 7, wherein the first gate electrode is connected to a signal line, the signal line transmitting a turn-on signal to the first gate electrode to electrically connect the first source electrode and the first drain electrode.

9. The array substrate according to claim 1, wherein a pixel further comprises a second TFT and a pixel electrode, the second TFT including a second gate electrode, a second active layer, a second source electrode, and a second drain electrode, the second gate electrode being electrically connected to a gate line, the second source electrode being electrically connected to a data line, and the second drain electrode being electrically connected to the pixel electrode.

10. The array substrate according to claim 9, wherein the array substrate further comprising a peripheral wiring region, control lines connected to sub-regions away from the peripheral wiring region are parallel to the data lines.

11. A semiconductor device, comprising one or more of the array substrates according to claim 1.

12. A fabrication method for fabricating an array substrate, the array substrate having a display region, the display region being divided into a plurality of sub-regions, comprising:
- forming a common electrode in a pixel;
- forming one or more switching units between different sub-regions for connecting common electrodes in the different sub-regions, wherein one of the one or more switching units is arranged between adjacent pixels, the adjacent pixels are located in two different sub-regions; and
- forming one or more control lines connected to each sub-region for providing a common voltage signal to the sub-region.

13. The fabrication method according to claim 12, further comprising:
- in each sub-region, forming at least one of one or more first common electrode lines along a first direction and one or more second common electrode lines along a second direction for electrically connecting the common electrodes, the first direction being different from the second direction;
- between adjacent pixels, forming a first thin-film transistor (TFT) with a first gate electrode, a first active layer, a first source electrode, and a first drain electrode, the first source electrode and the first drain electrode each being electrically connected to common electrodes contained in a different sub-region;
- in a pixel, forming a second TFT and a pixel electrode, the second TFT including a second gate electrode, a second active layer, a second source electrode, and a second drain electrode; and
- forming a plurality of gate lines and a plurality of data lines, a second gate electrode being electrically connected to a gate line, the second source electrode being electrically connected to a data line, and the second drain electrode being electrically connected to the pixel electrode, wherein:
- the first common electrode lines are parallel to the gate lines, the first gate electrodes, the second gate electrodes, the gate lines, and the first common electrode lines are formed in a same patterning process.

14. The fabrication method according to claim 13, wherein:
- the first source electrodes, the first drain electrodes, and the pixel electrodes are formed through a same patterning process; or
- the first source electrodes, the first drain electrodes, the second source electrodes, and the second drain electrodes are formed through a same patterning process.

15. The fabrication method according to claim 13, wherein:
- the second common electrode lines are parallel to the data lines;
- the second common electrode lines, the data lines, the second source electrodes, and the second drain electrodes are formed through a same patterning process; or
- the second common electrode lines and the pixel electrodes are formed through a same patterning process.

16. The fabrication method according to claim 13, wherein the array substrate further comprising a peripheral wiring region, the control lines connected to sub-regions away from the peripheral wiring region are parallel to the data lines, the control lines and the data lines being formed through a same patterning process.

17. A control method for controlling the array substrate, comprising:

transmitting a turn-on signal through signal lines to first TFTs in switching units connecting a desired range of sub-regions such that common electrodes in the desired range of sub-regions are electrically connected, wherein: the desired range of sub-regions contains a plurality of sub-regions, the common electrodes contained in the plurality of sub-regions provides a same common voltage, one of the first TFTs is arranged between adjacent pixels, and the adjacent pixels are located in two different sub-regions; and applying a common voltage signal to the common electrodes in the desired range of sub-regions through at least one control line connected to the desired range of sub-regions.

18. The control method according to claim 17, wherein the turn-on signal is applied on the first gate electrode of a first TFT in the desired range of sub-regions to electrically connect the first source electrode and the first drain electrode of the first TFT.

19. The control method according to claim 17, wherein a plurality of desired ranges of sub-regions include all sub-regions in the array substrate.

* * * * *